United States Patent
Taura et al.

(10) Patent No.: US 6,486,688 B2
(45) Date of Patent: Nov. 26, 2002

(54) SEMICONDUCTOR DEVICE TESTING APPARATUS HAVING A CONTACT SHEET AND PROBE FOR TESTING HIGH FREQUENCY CHARACTERISTICS

(75) Inventors: Toru Taura; Hirobumi Inoue; Michinobu Tanioka; Takahiro Kimura; Kouji Matsunaga, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/956,073

(22) Filed: Sep. 20, 2001

(65) Prior Publication Data

US 2002/0036514 A1 Mar. 28, 2002

(30) Foreign Application Priority Data

Sep. 26, 2000  (JP) ........................................ 2000-292861

(51) Int. Cl.[7] .............................................. G01R 1/073
(52) U.S. Cl. ...................... 324/757; 324/765; 324/158.1
(58) Field of Search ................................ 324/754–765; 439/482

(56) References Cited

U.S. PATENT DOCUMENTS

| | | | | | |
|---|---|---|---|---|---|
| 4,749,942 | A | * | 6/1988 | Sang et al. | 324/158 |
| 5,598,029 | A | * | 1/1997 | Suzuki | 257/665 |
| 5,825,192 | A | * | 10/1998 | Hagihara | 324/757 |
| 6,250,933 | B1 | * | 6/2001 | Khoury et al. | 439/66 |

FOREIGN PATENT DOCUMENTS

WO          WO 98/58266          12/1998

* cited by examiner

*Primary Examiner*—Michael Sherry
*Assistant Examiner*—Roshni Kurian
(74) *Attorney, Agent, or Firm*—Sughrue Mion, PLLC

(57) ABSTRACT

A semiconductor device testing apparatus that has a laminate structure composed of a contact sheet having a first opening, an elastic sheet having a second opening and a base plate having a third opening. A supply voltage is applied to an external terminal located on a peripheral portion of the contact sheet. A probe of a probe portion is contacted to a signal electrode of a semiconductor device through the third, second and first openings.

38 Claims, 7 Drawing Sheets

SEMICONDUCTOR DEVICE TESTING APPARATUS HAVING A CONTACT SHEET AND PROBE FOR TESTING HIGH FREQUENCY CHARACTERISTICS

BACKGROUND OF THE INVENTION

1. Field of the Invention

The present invention relates to a semiconductor device testing apparatus, and more particularly to a semiconductor device testing apparatus using a contact sheet made of a flexible and thin sheet material and a high frequency probe having a general structure, in which the supply voltage is applied to the semiconductor device from the power source via an external terminal located on the contact sheet, and in which the high frequency probe contacts with a signal electrode and performs the measurement.

2. Description of the Related Art

A semiconductor device that operates in a bandwidth of equal to or more than 10 GHz often has more supply voltage and ground electrodes, that is, more electrodes for high and low supply voltages and less signal electrodes for inputting and/or outputting operating signals in order to lower the power source impedance. A flexible membrane sheet is often used in a testing apparatus to measure the electrical characteristics of such a semiconductor device.

FIG. 1 is a cross sectional view of a probe card described in Kokusai Kokai No. WO98/58266 as a probe card structure of a semiconductor device testing apparatus using a conventional flexible membrane sheet.

In this figure, by contacting a pad 23a of a semiconductor device 23 to a bump 5c on a flexible membrane sheet 5 located on a printed board 4, power source voltage is supplied through a power supply wiring and a signal is extracted from a signal wiring by connecting a terminal 6 to the wiring on the printed board 4. Particularly, when conducting a high frequency signal, a micro-strip structure, in which signal wiring is formed on the front surface and a ground line is entirely formed on the back surface, is often used.

However, as seen in this figure, because the membrane sheet 5 is inserted in bent shape, the distance between a signal line on the front surface and a ground line on the back surface changes at the bent area and the characteristic impedance of the micro-strip line, which is determined by the distance between the signal line and the ground line, changes. Moreover, the characteristic impedance is disturbed by a discontinuous structure at a junction between the membrane sheet 5 and the printed board 4. When testing a semiconductor device whose operating frequency is low, these effects are small and it is possible to perform the measurement. However, when testing a semiconductor device whose operating frequency is equal to or more than 10 GHz, these effects are large and there is a problem that using a probe structure with the conventional membrane sheet 5 limits the frequency characteristic of a line which transfers a high frequency signal, and the electrical characteristic of the semiconductor device cannot be measured accurately.

SUMMARY OF THE INVENTION

An object of the present invention, related to the than the contact sheet, covering the first and second supply voltage applying electrodes and located on the opposite side from the side where said first and second supply voltage applying electrodes of the contact sheet are located; a base plate having a concavity with a shape that matches the outer dimension and thickness of the elastic sheet and the contact sheet, and installed the elastic sheet and the contact sheet in the concavity such that the first and second supply voltage applying electrodes are exposed; a power source portion for applying a predetermined supply voltage to the external terminal on said contact sheet; and a probe portion having a position setting section moving X and Y directions, and Z direction perpendicular to the X and Y directions, assuming the surface of the base plate to be an X-Y plane, and a high frequency probe coupled to the position setting section to electrically contact to the signal electrode of the semiconductor device.

The above mentioned semiconductor device testing apparatus may be such a structure as the contact sheet has a first opening formed at a portion where the first and second wirings are absent; the elastic sheet has a second opening connected with the first opening; the base plate has a third opening connected with the second opening; and a high frequency probe is contacted to the signal electrode through the third, second and first openings.

Further, the semiconductor device testing apparatus may be a structure in which a through-hole filled with a conductive material is formed at a portion of the contact sheet on the measurement of an electrical characteristic of a semiconductor device that has many electrodes and operates at high frequency, is to provide a semiconductor device testing apparatus that applies supply voltages including ground voltage by making an accurate contact with many electrodes, and performs a high frequency signal measurement.

In order to achieve the above object, according to the present invention, there is provided a semiconductor device testing apparatus for testing an electrical characteristic of a semiconductor device which has a first electrode applied a high supply voltage, e.g. positive voltage from a power source, a second electrode applied a low power source voltage, e.g. ground voltage or negative voltage from a power source and signal electrode for inputting and/or outputting an operating signal formed, respectively, on its front surface side. The apparatus comprises a device stage holding the semiconductor device to be tested; a contact sheet including a insulating sheet, first and second supply voltage applying electrodes on the insulating sheet and electrically contacting with the first and second electrodes of the semiconductor device, respectively, at the testing state, first and second external terminals located on a peripheral portion on the insulating sheet and positioned with a lager interval each other than that of the first and second supply voltage applying electrodes, a first wiring connecting the first supply voltage applying electrode and the first external terminal, a second wiring connecting the second supply voltage applying electrode and the second external terminal; elastic sheet having a smaller size signal electrode; a first signal testing electrode connected to the conductive material at one end of the through-hole and contacting the signal electrode is formed; a extracting out wiring layer connected to the conductive material at the other of the through-hole and extending on the contact sheet is formed; a second signal testing electrode connected to the extracting out wiring layer is formed; the high frequency probe is contacted to the second signal testing electrode of the semiconductor device through openings provided, respectively, in the base plate and the elastic sheet; and a support ring located on the side opposite from the second signal testing electrode is provided to support the portion of the contact sheet where the second signal testing electrode is formed.

Moreover, the semiconductor device testing apparatus may be a structure in which a through-hole filled with a conductive material is formed at a portion of the contact sheet on the signal electrode; a first signal testing electrode connected to the conductive material at one end of the through-hole and contacting the signal electrode is formed; a second signal testing electrode connected to the conductive material at the other end of the through-hole is formed; and the high frequency probe is contacted to the second signal testing electrode of the semiconductor device through openings provided, respectively, in the base plate and the elastic sheet.

Further, each of the first and second supply voltage applying electrodes of the contact sheet may have a bump electrode structure. Or else, each of the first and second electrodes of the semiconductor device may have a bump electrode structure.

Furthermore, the first signal-testing electrode on the contact sheet may have a bump electrode structure. Or else, the signal electrode of the semiconductor device may have a bump electrode structure.

Yet further, a bypass capacitor connecting between the first wiring and the second wiring may be provided.

Moreover, the contact sheet may have a larger area than the semiconductor device to be tested.

Further, the semiconductor device may be tested in a semiconductor wafer state in which a plurality of the semiconductor devices are formed. Or else, a form of the semiconductor device to be tested may be a bare chip diced from a semiconductor wafer.

Furthermore, the semiconductor device testing apparatus may further comprise a scrubbing portion. The scrubbing portion includes a piezoelectric device moving the device stage and a controller to control the piezoelectric device so that the electrodes on the semiconductor device and the electrodes on the contact sheet are relatively vibrated at their contact state to break a thin oxide film which has been unfavorably formed on the surface on said electrodes.

DETAILED DESCRIPTION OF THE PREFERRED EMBODIMENTS

FIG. 2 to FIG. 5 show a semiconductor device testing apparatus according to a first embodiment of the present invention.

Figure 2:
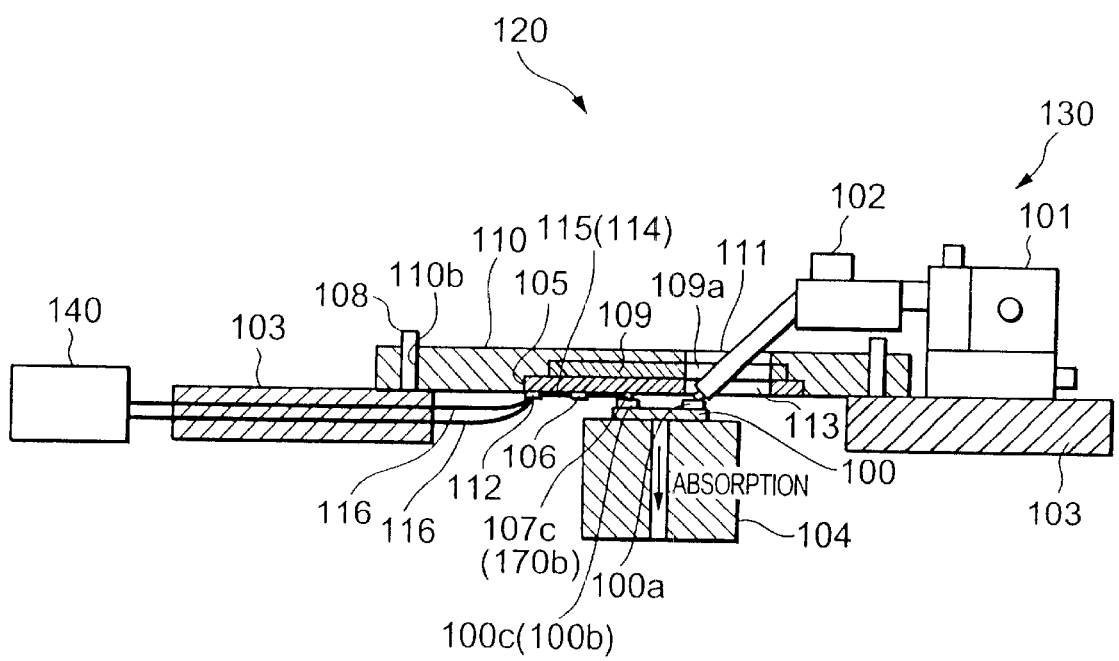
FIG. 2 shows a structure in which supply voltage is supplied to a semiconductor device from a contact sheet and a signal measurement is performed at a high frequency probe in a first embodiment of the present invention.

At first, referring to FIG. 2, the testing apparatus comprises a stage 103, a measuring head portion 120 provided on the stage 103, a probe portion 130 on the stage 103, a power source portion 140, and a device stage 104.

A semiconductor device 100 to be tested has a first electrode 100c applied a positive supply source voltage, a second electrode (not shown in FIG. 2) applied a ground voltage and a signal electrode 100a for inputting and/or outputting an operating signal on its front surface side. The back surface of the semiconductor device 100 is absorbed by vacuum as shown in arrow so that the semiconductor device 100 is held and fixed on the device stage 104.

The measuring head portion 120 is constituted of a contact sheet 105 having a first opening 113, a bypass capacitor 106, an elastic film 109 such as an elastomer film 109, and a base plate 110. The elastic sheet film 109 has a smaller size than that of the contact sheet 105, and has a second opening 109a continuously formed with the first opening 113. The base plate 110 has a third opening 111 continuously formed with the second opening 109a, and positioning holes 110b to which pins 108 from the stage 103 are inserted to fix the base plate 110 to a predetermined position of the base stage.

From the power source portion 140 for applying a predetermined supply voltage to external terminals 112 of contact sheet by power supply voltage wirings 116.

The probe portion 130 has a position setting section 101 moving X and Y directions, and Z direction perpendicular to the X and Y directions, assuming the upper surface of the base plate 110 to be an X-Y plane, that is the front surface of the semiconductor device to be an X-Y plane, and a high frequency probe 102 coupled to the position setting section 101. The high frequency probe is contacted to the signal electrode 100a through the third, second and first openings 111, 109a and 113.

The high frequency probe 102 has a general structure, for example, a coaxial structure which has good high frequency characteristics.

For a probe stage 103, one measuring head portion is selected from the measuring head portions 120 to match the position of the electrode of the semiconductor device 100 to be tested. The selected measuring head portion 120 is loaded and held to the stage using a position-determining holes 110b located at four corners of the base plate 110 and position-determining pins 108 located on the probe stage 103. The same number of the probe portions 130 as that of the signal electrodes 100a are loaded and screwed into the stage.

Figure 3:
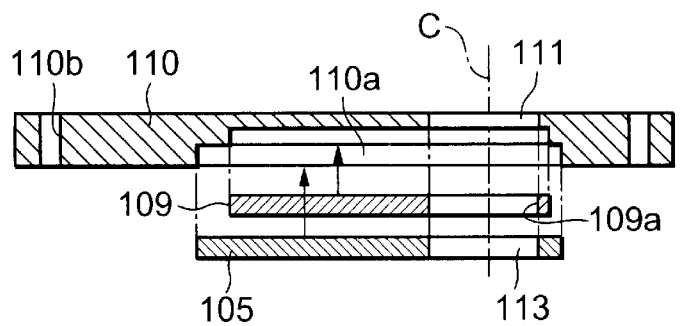
FIG. 3 is a detailed explanatory diagram of the inserting position of the contact sheet, an elastic sheet such as an elastomer sheet, and a base plate in FIG.2.
Figure 4:
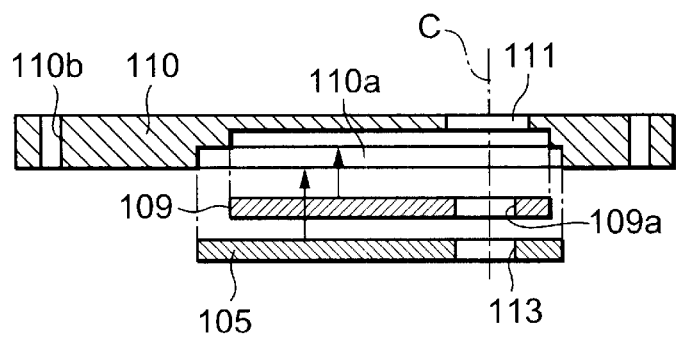
FIG. 4 shows a modified example in which the size of a first opening, a second opening, and a third opening, shown in FIG. 3, differs.

As shown in FIG. 3 and FIG. 4, the elastic sheet 109 is inserted in the deeper portion of concavity 110a of base plate 110 and the contact sheet 105 is inserted in the shallower portion of concavity 110a of base plate 110 so that electrodes 107c, 107b (FIG. 5A) are exposed in down direction in figures.

In FIG. 3, the contact sheet 105 is screwed to the base plate 110 with screws that are not shown in the figure. The contact sheet 105 is screwed after the center C (shown as a dotted line in FIG. 3) of the first opening 113, the second opening 109a, and the third opening 111 is aligned.

Here, the size of the third opening 111 may differ from the size of the first opening 113 and the second opening 109a as shown in FIG.4, and the each opening shape may be a circular cone.

Figures 5A, 5B:
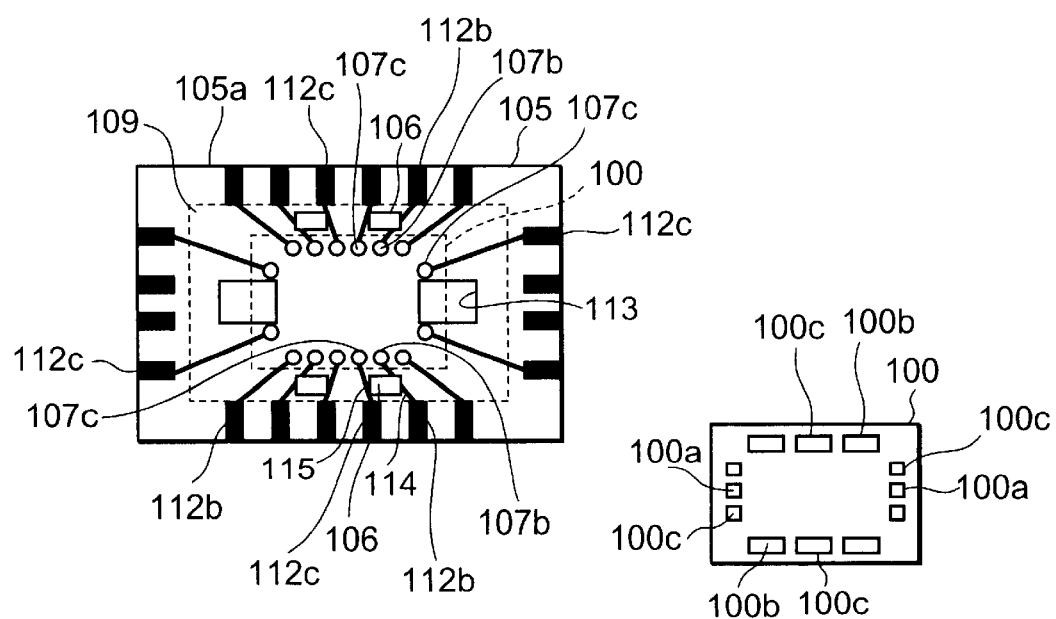
FIG. 5A is a plan view of the contact sheet, the elastic sheet and the semiconductor device shown in FIG. 2.
FIG. 5B is a plan view showing the arrangement of the electrodes of the semiconductor device.

Referring to FIG. 5A and FIG. 5B, The contact sheet 105 includes a thin insulating sheet 105a with a thickness of a few tens of $\mu$m and is made of resin, an insulator material such as polyimide, polyester, or polystyrol. The contact sheet 105, that is, the insulating sheet 105a is flexible and its external size is larger than the semiconductor device 100.

Further, the contact sheet 105 include first supply voltage applying electrodes 107c having bump structure on the insulating sheet 105a and electrically contacting with the first electrodes 100c of the semiconductor device 100, and second supply voltage applying electrodes 107b having bump structure on the insulating sheet 105a and electrically contacting with the second electrodes 100b of the semiconductor device 100.

First and second external terminals 112b, 112c of printed pattern are provided located on a peripheral portion on the insulating sheet 105a and positioned with a ten times, approximately, larger interval each other than that of the first and second supply voltage applying electrodes 107b, 107c.

First and second wirings 115, 114 of printed pattern are located so that the interval between two wirings increases gradually when it spreads from the supply voltage applying electrodes to the external terminals. The first wiring 115 connecting electrically the first supply voltage applying electrode 107c and the first external terminal 112c, and the second wiring 114 connecting electrically the second supply voltage applying electrode 107b and the second external terminal 112b.

Further, bypass capacitors 106 electrically connecting between the first wiring 115 and the second wiring 114 are provided.

In order to measure an electrical characteristic of the semiconductor device 100 with the semiconductor device testing apparatus constructed in a such manner, the electrodes 107c, 107b of bump structure on the contact sheet 105 contact with the electrodes 100c, 100b of the semiconductor device 100, and power is supplied from the power source portion 140 through the external electrode 112c 112b. Then, the positions of the first to third openings 113, 109a and 111 are located at the position facing the signal electrode 100a, and the tip of the high frequency probe 102 are determined by the positioner 101. The probe is inserted into the openings and contacted with the signal electrode 100a of the semiconductor device 100. With this condition, the electrical characteristic of the semiconductor device 100 is measured with an instrument not shown in the figure, which is connected to the high frequency probe 102.

In the testing apparatus constructed in the above manner, the contact sheet 105, wherein the arrangement of the bump electrodes 107c, 107b and the position of the openings are matched with each semiconductor device 100, is inserted, and the appropriate measuring head portion is selected from several different kinds of the prepared measuring head portion 120 to match with the semiconductor device 100 to be measured. Using the base plate 110, the measuring head portion 120 is positioned and fixed so that it matches with the position of the electrodes of the semiconductor device 100. After the high frequency probe 102 is positioned and fixed using the positioner 101, the semiconductor device 100 is loaded, the device stage 104, where the semiconductor device is chucked and fixed, is raised, and the probe is contacted with each electrode on the semiconductor device 100. When this contact is made, by elastically deforming, the elastomer 109 as the elastic sheet 109 absorbs the height variation of the bump terminals 107c, 107b, and contact between each electrode of the semiconductor device 100 such as the ground electrode 100b or source electrode 100c and the bump electrodes 107b or 107c is made for certain. Moreover, power is supplied to the semiconductor device 100 from the external terminal 112c, 112b on the contact sheet 105.

Figure 6:
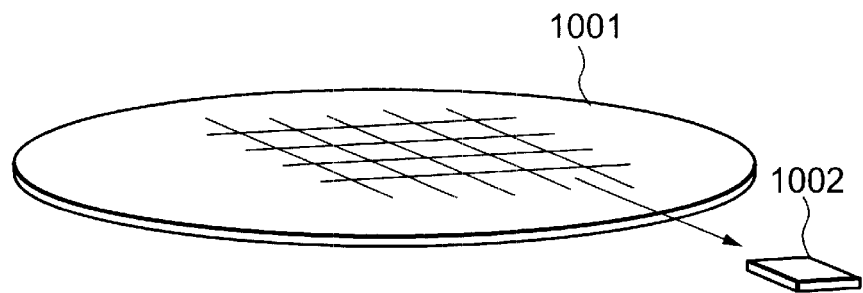
FIG. 6 is a perspective view showing a configuration example of a semiconductor device to be measured with a semiconductor device testing apparatus of the present invention.

FIG. 6 shows the form of a semiconductor device to be measured using a semiconductor device testing apparatus of the present invention. Namely, in the first embodiment, a bare chip 1002 diced from a semiconductor wafer 1001 is an object of the measurement.

Figure 7:
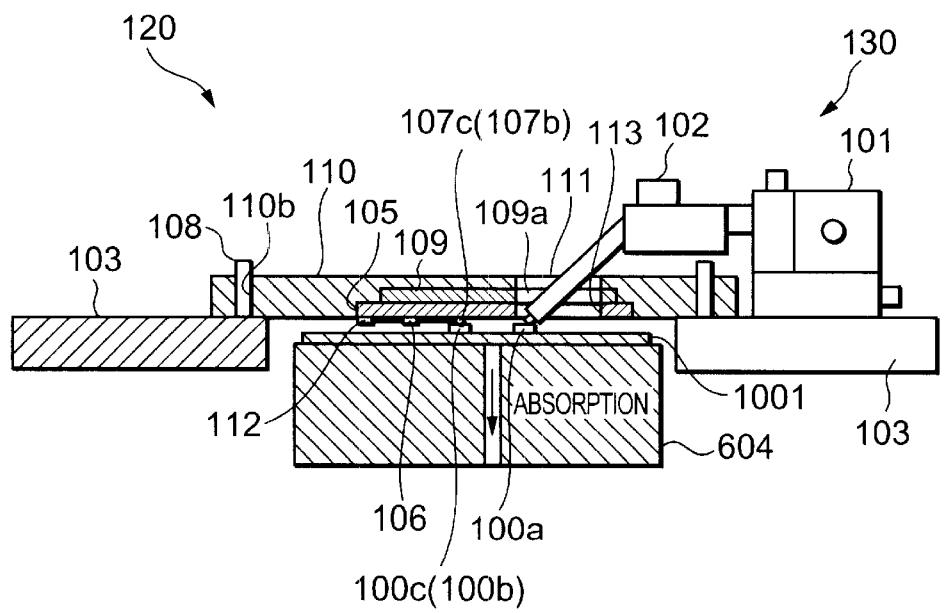
FIG. 7 shows a modified example in which the first embodiment is applied to a testing apparatus of a semiconductor wafer.
Figure 8A:
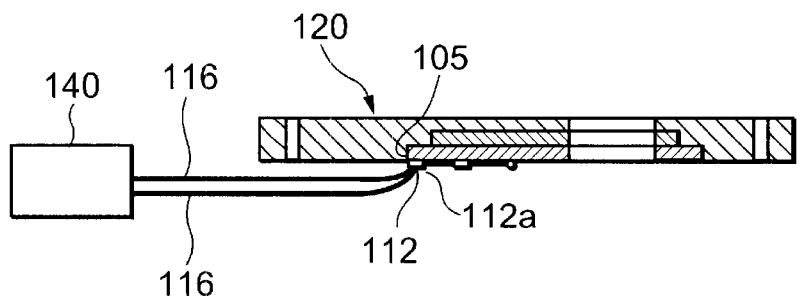
FIGS. 8A to 8D show modified examples of a power supply voltage wiring connecting to the external terminal on the contact sheet in the first embodiment of a semiconductor device testing apparatus of the present invention.
Figure 8B:
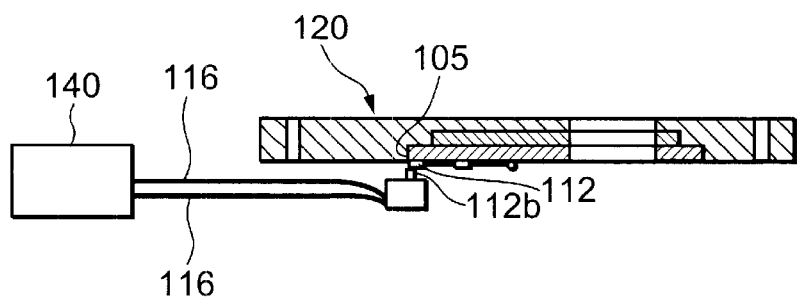
Figure 8C:
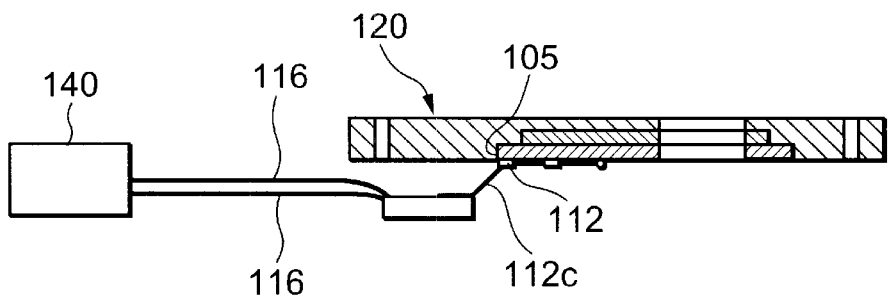
Figure 8D:
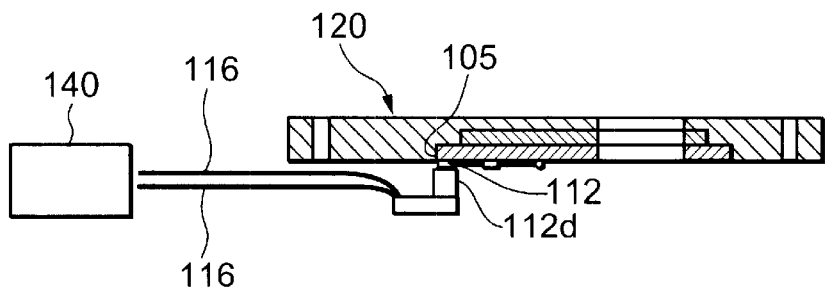

FIG. 7 shows a modified example where the form of a semiconductor device to be measured is the wafer 1001. A device stage 604 has a large enough outer dimension to load the wafer 1001. After the device stage 604 loaded with the wafer 1001 is moved, and the measuring head portion 120 and the probe portion 130 are positioned to a predetermined measurement position on the wafer 1001, the high frequency probe 102 contacts with electrodes of the semiconductor device on the wafer 1001 and the measurement is performed.

FIGS. 8A to 8D show modified examples for the configuration of power supply by the power supply voltage wirings 116. At this time, any one of the following structures to make a contact to the external terminal 112c, 112b can be taken: a structure such as (FIG. 8A) in which the contact is performed directly through a soldered portion 112a, a structure such as (FIG. 8B) in which a pogo-pin 112b using spring action is contacted, a structure such as (FIG. 8C) in which a needle 112c is used to make the contact, and a structure such as (FIG. 8D) in which an anisotropic conductive sheet 112d is used to make the contact.

Figure 1:
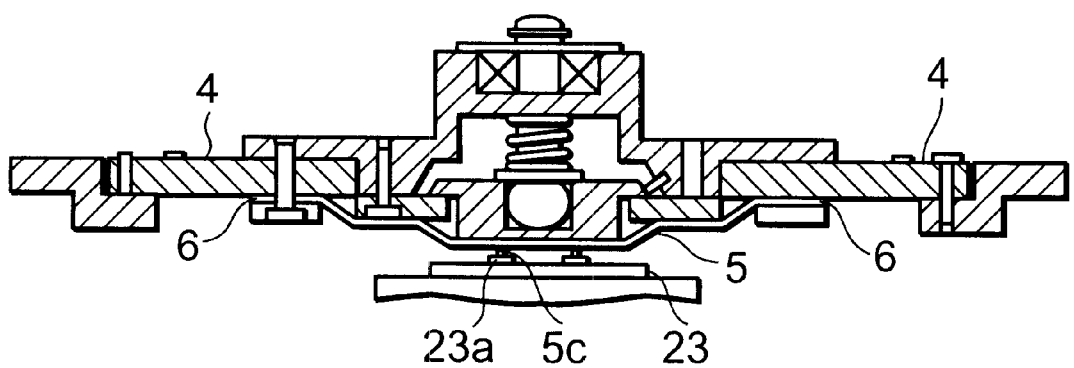
FIG. 1 shows a probe card structure of a conventional semiconductor device testing apparatus.

Then, for the contact to the signal electrode 100a and for the measurement, the high frequency probe 102 is used as in FIG. 1. Using the positioner 101, the high frequency probe 102 is positioned at the position of the third opening 111, inserted, and then contacted to the signal electrode 100a of the semiconductor device 100.

Figure 9:
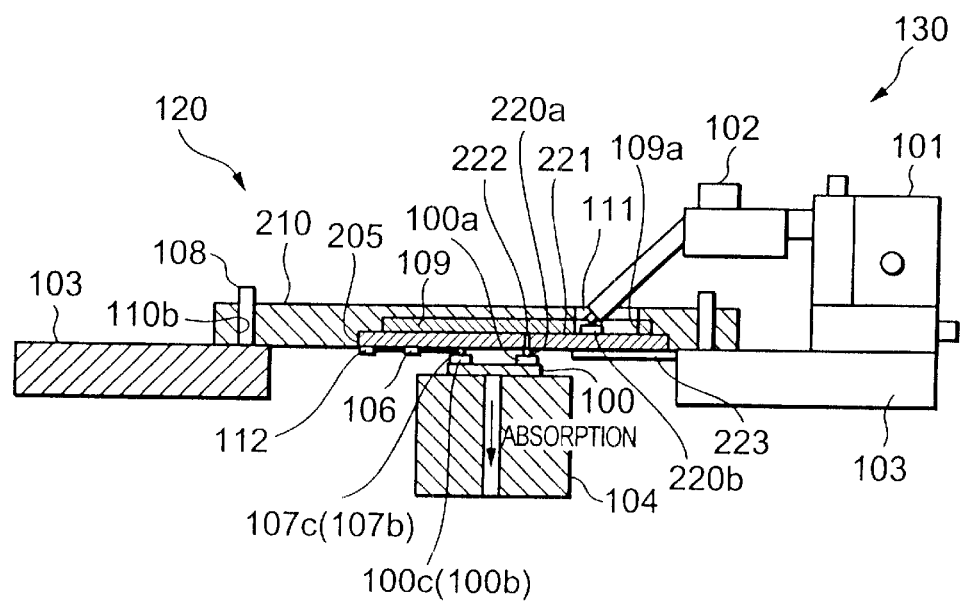
FIG. 9 shows a structure in which a signal electrode of a semiconductor device is extracted out to a contact electrode as a signal testing electrode on the contact sheet as a second embodiment of a semiconductor device testing apparatus of the present invention.

FIG. 9 shows a second embodiment of the semiconductor device testing apparatus of the present invention.

A contact sheet 205 has a bump electrode 220a as a first signal testing electrode 220a, the first bump electrode 107c and the second bump electrode 107b positioned, respectively, to match the layout of the signal electrode 100a, source electrode 100c and ground electrode 100b on the semiconductor device 100. A contact electrode 220b as a second signal testing electrode 220b is electrically connected to the bump electrode 220a positioned at the position on the signal electrode 100a through a through-hole 222 filled with a conductive material and an extraction line 221 of printed pattern. A metal plate as a support ring 223 is located on the back side of the contact electrode 220b. The method of supplying power to the semiconductor device 100 is the same as the method in the embodiment shown in FIG. 2, and power is supplied from the external terminal 112 (112c, 112b) on the contact sheet 205. As to the contact of the high frequency probe 102 with the signal electrode 100a of the semiconductor device 100, after the high frequency probe 102 is positioned by the positioner 101 to match with the position of the second opening 109a and the third opening 111, the probe is inserted and contacted to the contact electrode 220b supported by the support ring 223, and the electrical characteristic of the semiconductor device 100 can be measured.

Figure 10:
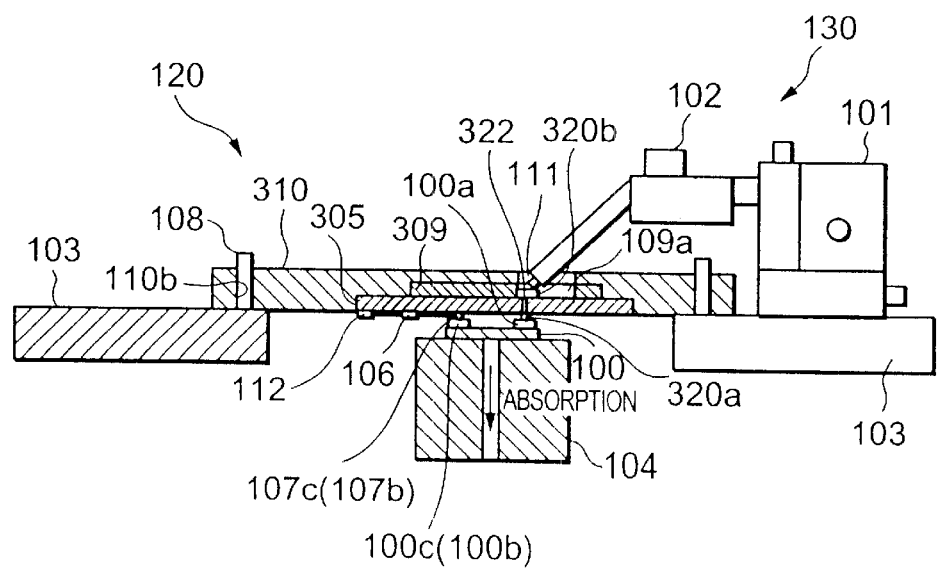
FIG. 10 shows a structure in which a contact electrode as a signal testing electrode on the contact sheet is positioned directly above a signal electrode of a semiconductor device as a third embodiment of a semiconductor device testing apparatus of the present invention.

Further, FIG. 10 shows a third embodiment of the semiconductor device testing apparatus of the present invention.

A contact sheet 305 has a bump electrode 320a as a first signal testing electrode on the signal electrode 100a of the semiconductor device 100. The bump electrode 320a is electrically connected through a through-hole 322 filled with a conductive material to a contact electrode 320b as a second signal testing electrode on the contact sheet 305. Besides that, as in the contact sheet 205 and contact sheet 105, the contact sheet 305 has the same structure.

The power is supplied to the semiconductor device 100 through the contact sheet 305, the high frequency probe 102 is contacted to the contact electrode 320b, and the electrical characteristic of the semiconductor device 100 is measured.

Figure 11:
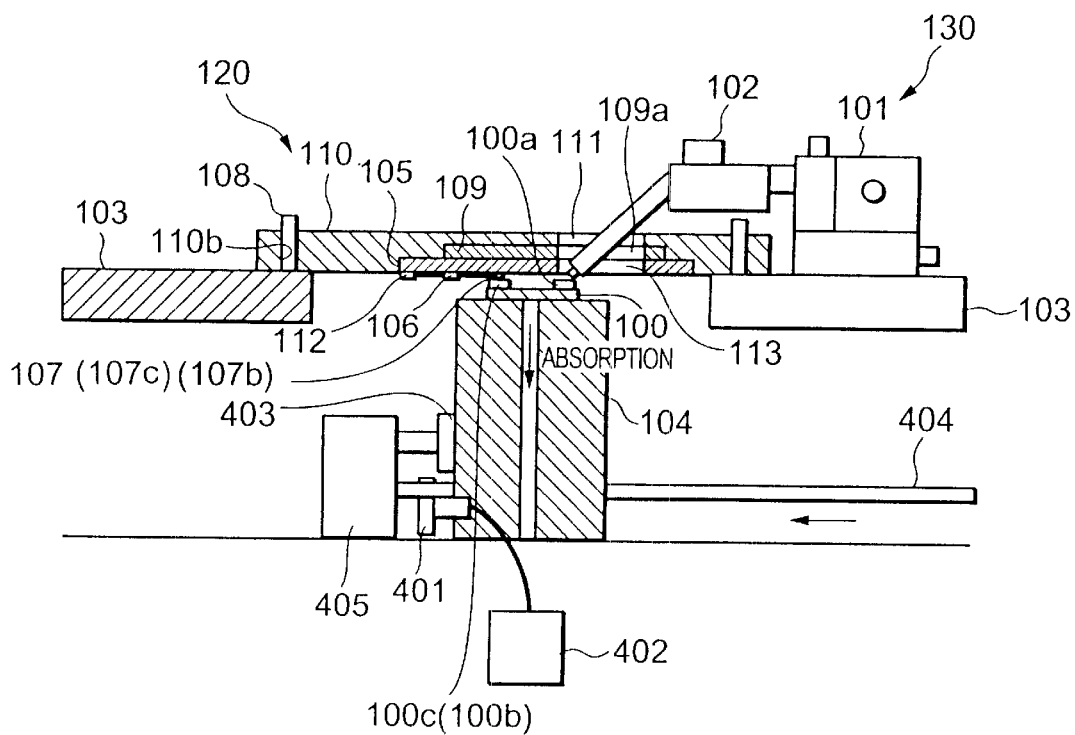
FIG. 11 shows a structure in which a scrubbing portion is added as a forth embodiment of a semiconductor device testing apparatus of the present invention.

FIG. 11 shows a forth embodiment about the mechanism to make a electrical contact between the electrodes on the semiconductor device 100 and the bumps 107 on the contact sheet 105 with low resistance.

In this embodiment, there is a scrub portion composed of a controller 402 and a piezoelectric device 401. The semiconductor device 100 to be tested is chucked and fixed on the device stage 104. After the device stage 104 is carried to a predetermined position and fixed using a cylinder 404 and a damper 403, the device stage 104 is raised and the electrodes on the semiconductor device are contacted with the electrodes on the contact sheet 105. When each electrode on the semiconductor device 100 and each electrode on the contact sheet 105 are in contact, by applying a fixed amount of voltage to the piezoelectric device 401 equipped to the device stage 104 using the controller 402, a supporting member 405 is pushed a fixed amount and the device stage 104 is moved slightly in the horizontal direction. Thus, each electrode on the semiconductor device 100 and each electrode on the contact sheet 105 slide against each other, the thin oxide film naturally formed on the electrode is broken, and good contact is achieved.

Figure 12:
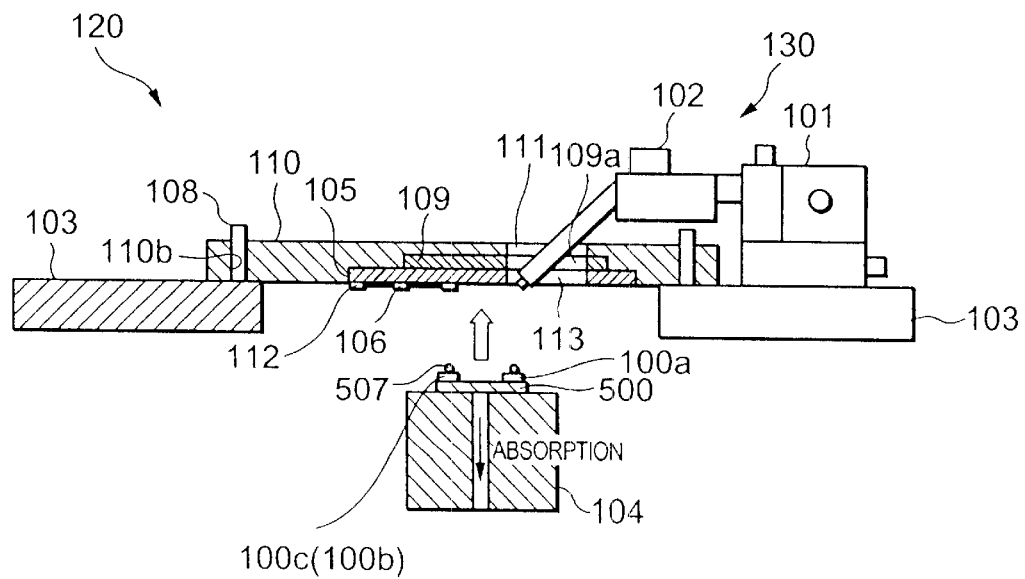
FIG. 12 shows a structure in which the bumps are removed from the contact sheet and the contact is made on a semiconductor device loaded with the bumps in advance as a fifth embodiment of a semiconductor device testing apparatus of the present invention.

FIG. 12 shows a fifth embodiment in which the contact and measurement are made on bumps 507 loaded on a semiconductor device 500 in advance. The bumps 507 loaded on the source electrode and ground electrode of the semiconductor device 500 are contacted to the source wiring and ground wiring on the contact sheet 105. The bump 507 loaded on the signal electrode of the semiconductor device 500 is contacted to the high frequency probe 102. Here, the bump 507 may be gold or solder bump, and its shape may be a stud or a pillar.

In the semiconductor device testing apparatus of the present invention, because there is no need of the signal wiring on the surface of the contact sheet where the supply voltage applying means is provided, a wide space can be available for a source pattern and a ground pattern of the supply voltage applying means, at the same time, and because the bypass capacitor can be loaded close to the bumps that make contact with the electrodes of the semiconductor device, the source impedance can be lowered. In addition to these, the apparatus has a structure of making contact directly to the signal electrode of the semiconductor device with a coaxial high frequency probe that has good frequency characteristics. Combining these two features, the electrical characteristics of the semiconductor device can be measured accurately to a high frequency range.

In addition, because the apparatus has a structure in which the contact sheet is inserted and held flat, there is no portion of the sheet where is bent and the characteristic impedance of the extraction line can be kept uniform. Therefore, an electrical characteristic of the semiconductor device can be measured accurately to a high frequency range.

Moreover, the size of the semiconductor device to be measured, especially a high frequency device that operates at a bandwidth equal to or more than 10 GHz, is small, a few mm square, and the device has a structure with many source electrodes as the first electrodes and ground electrodes as the second electrodes to lower the power source impedance in many cases. Thus, the distance between the electrodes becomes narrow. Because the contact sheet used in the semiconductor device testing apparatus of the present invention may have a structure using a minute bump to make contact with the source electrode and ground electrode, the bumps contact all of the source electrodes and ground electrodes on the high frequency device and the impedance of the source system can be kept low for the measurement of the electrical characteristic. Therefore, the measurement of the electrical characteristic can be performed accurately.

What is claimed is:

1. A semiconductor device testing apparatus for testing an electrical characteristic of a semiconductor device, said semiconductor device having a first electrode, a second electrode and a signal electrode formed, respectively, on its front surface side, said apparatus comprising:
a device stage holding said semiconductor device to be tested;
a measuring head portion including a contact sheet, an elastic sheet and a base plate;
a power source portion for applying a supply voltage; and
a probe portion including a probe setting section and a probe;
said contact sheet of said measuring head portion having an insulating sheet, first and second supply voltage applying electrodes formed on said insulating sheet and electrically contacting with said first and second electrodes of said semiconductor device, respectively, at the testing state, first and second external terminals for applying said supply voltage from said power source portion, located on a peripheral portion of said insulating sheet and positioned with a larger interval each other than that of said first and second supply voltage applying electrodes, a first wiring connecting said first supply voltage applying electrode and said first external terminal, and a second wiring connecting said second supply voltage applying electrode and said second external terminal;

said elastic sheet of said measuring head portion having a smaller size than said contact sheet, covering said first and second supply voltage applying electrodes and located on the opposite side from the side where said first and second supply voltage applying electrodes of said contact sheet are located;

a base plate of said measuring head portion having a concavity with a shape that matches the outer dimension and thickness of said elastic sheet and said contact sheet, and installed said elastic sheet and said contact sheet in said concavity such that said first and second supply voltage applying electrodes of said contact sheet are exposed;

wherein said contact sheet has a first opening formed at a portion where said first and second wirings are absent and on said signal electrode of said semiconductor device; said elastic sheet has a second opening connected with said first opening; said base plate has a third opening connected with said second opening; and said probe of said probe portion is contacted to said signal electrode of said semiconductor device through said third, second and first openings.

2. A semiconductor device testing apparatus as claimed in claim 1, wherein each of said first and second supply voltage applying electrodes of said contact sheet has a bump electrode structure.

3. A semiconductor device testing apparatus as claimed in claim 1, wherein each of said first and second electrodes of said semiconductor device has a bump electrode structure.

4. A semiconductor device testing apparatus as claimed in claim 1, wherein a bypass capacitor connecting between said first wiring and said second wiring is provided.

5. A semiconductor device testing apparatus as claimed in claim 1, wherein said contact sheet has a larger area than said semiconductor device to be tested.

6. A semiconductor device testing apparatus as claimed in claim 1, wherein said semiconductor device is tested in a semiconductor wafer state in which a plurality of said semiconductor devices are formed.

7. A semiconductor device testing apparatus as claimed in claim 1, wherein a form of said semiconductor device to be tested is a bare chip diced from a semiconductor wafer.

8. A semiconductor device testing apparatus as claimed in claimed 1, further comprising a scrubbing portion; said scrubbing portion includes a piezoelectric device moving said device stage and a controller to control said piezoelectric device so that said electrodes on said semiconductor device and said electrodes on said contact sheet are relatively vibrated at their contact state to break a thin oxide film which has been unfavorably formed on the surface on said electrodes.

9. A semiconductor device testing apparatus as claimed in claim 1, wherein said first and second external terminals are connected to power supply voltage wirings from said power source portion by a soldered portion.

10. A semiconductor device testing apparatus as claimed in claim 1, wherein said first and second external terminals are connected to power supply voltage wirings from said power source portion by a pogo-pin.

11. A semiconductor device testing apparatus as claimed in claim 1, wherein said first and second external terminals are connected to power supply voltage wirings from said power source portion by a needle.

12. A semiconductor device testing apparatus as claimed in claim 1, wherein said first and second external terminals are connected to power supply voltage wirings from said power source portion by an anisotropic conductive sheet.

13. A semiconductor device testing apparatus for testing an electrical characteristic of a semiconductor device, said semiconductor device having a first electrode, a second electrode and a signal electrode formed, respectively, on its front surface side, said apparatus comprising:

a device stage holding said semiconductor device to be tested;

a measuring head portion including a contact sheet, an elastic sheet and a base plate;

a power source portion for applying a supply voltage; and a probe portion including a probe setting section and a probe;

said contact sheet of said measuring head portion having an insulating sheet, first and second supply voltage applying electrodes formed on said insulating sheet and electrically contacting with said first and second electrodes of said semiconductor device, respectively, at the testing state, first and second external terminals for applying said supply voltage from said power source portion, located on a peripheral portion of said insulating sheet and positioned with a larger interval each other than that of said first and second supply voltage applying electrodes, a first wiring connecting said first supply voltage applying electrode and said first external terminal, and a second wiring connecting said second supply voltage applying electrode and said second external terminal;

said elastic sheet of said measuring head portion having a smaller size than said contact sheet, covering said first and second supply voltage applying electrodes and located on the opposite side from the side where said first and second supply voltage applying electrodes of said contact sheet are located;

a base plate of said measuring head portion having a concavity with a shape that matches the outer dimension and thickness of said elastic sheet and said contact sheet, and installed said elastic sheet and said contact sheet in said concavity such that said first and second supply voltage applying electrodes of said contact sheet are exposed;

wherein said contact sheet has a through-hole filled with a conductive material on said signal electrode of said semiconductor device; a first signal testing electrode connected to said conductive material at one end of said through-hole for contacting said signal electrode of said semiconductor device; an extracting out wiring layer connected to said conductive material at the other of said through-hole and extending on a surface of said contact sheet and a second signal testing electrode connected to said extracting out wiring layer; said elastic sheet has an opening on said second signal testing electrode of said contact sheet to expose said second signal testing electrode; said base plate has a opening connected with said opening of said elastic sheet; said probe of said probe portion is contacted to said second signal testing electrode of said contact sheet through openings provided, respectively, in said base plate and said elastic sheet; and a support ring located on the side opposite from said second signal testing electrode is provided to support the portion of said contact sheet where said second signal testing electrode is formed.

14. A semiconductor device testing apparatus as claimed in claim 13, wherein each of said first and second supply voltage applying electrodes of said contact sheet has a bump electrode structure.

15. A semiconductor device testing apparatus as claimed in claim 13, wherein each of said first and second electrodes of said semiconductor device has a bump electrode structure.

16. A semiconductor device testing apparatus as claimed in claim 13, wherein a bypass capacitor connecting between said first wiring and said second wiring is provided.

17. A semiconductor device testing apparatus as claimed in claim 13, wherein said contact sheet has a larger area than said semiconductor device to be tested.

18. A semiconductor device testing apparatus as claimed in claim 13, wherein said semiconductor device is tested in a semiconductor wafer state in which a plurality of said semiconductor devices are formed.

19. A semiconductor device testing apparatus as claimed in claim 13, wherein a form of said semiconductor device to be tested is a bare chip diced from a semiconductor wafer.

20. A semiconductor device testing apparatus as claimed in claim 13, further comprising a scrubbing portion; said scrubbing portion includes a piezoelectric device moving said device stage and a controller to control said piezoelectric device so that said electrodes on said semiconductor device and said electrodes on said contact sheet are relatively vibrated at their contact state to break a thin oxide film which has been unfavorably formed on the surface on said electrodes.

21. A semiconductor device testing apparatus as claimed in claim 13, wherein said first and second external terminals are connected to power supply voltage wirings from said power source portion by a soldered portion.

22. A semiconductor device testing apparatus as claimed in claim 13, wherein said first and second external terminals are connected to power supply voltage wirings from said power source portion by a needle.

23. A semiconductor device testing apparatus as claimed in claim 13, wherein said first and second external terminals are connected to power supply voltage wirings from said power source portion by a pogo-pin.

24. A semiconductor device testing apparatus as claimed in claim 13, wherein said first and second external terminals are connected to power supply voltage wirings from said power source portion by an anisotropic conductive sheet.

25. A semiconductor device testing apparatus for testing an electrical characteristic of a semiconductor device, said semiconductor device having a first electrode, a second electrode and a signal electrode formed, respectively, on its front surface side, said apparatus comprising:
a device stage holding said semiconductor device to be tested;
a measuring head portion including a contact sheet, an elastic sheet and a base plate;
a power source portion for applying a supply voltage; and
a probe portion including a probe setting section and a probe;
said contact sheet of said measuring head portion having an insulating sheet, first and second supply voltage applying electrodes formed on said insulating sheet and electrically contacting with said first and second electrodes of said semiconductor device, respectively, at the testing state, first and second external terminals for applying said supply voltage from said power source portion, located on a peripheral portion of said insulating sheet and positioned with a larger interval each other than that of said first and second supply voltage applying electrodes, a first wiring connecting said first supply voltage applying electrode and said first external terminal, and a second wiring connecting said second supply voltage applying electrode and said second external terminal;
said elastic sheet of said measuring head portion having a smaller size than said contact sheet, covering said first and second supply voltage applying electrodes and located on the opposite side from the side where said first and second supply voltage applying electrodes of said contact sheet are located;
a base plate of said measuring head portion having a concavity with a shape that matches the outer dimension and thickness of said elastic sheet and said contact sheet, and installed said elastic sheet and said contact sheet in said concavity such that said first and second supply voltage applying electrodes of said contact sheet are exposed;
wherein said contact sheet has a through-hole filled with a conductive material on said signal electrode of said semiconductor device; a first signal testing electrode connected to said conductive material at one end of said through-hole for contacting said signal electrode of said semiconductor device and a second signal testing electrode connected to said conductive material at the other end of said through-hole; said elastic sheet has an opening on said second signal testing electrode of said contact sheet to expose said second signal testing electrode; said base plate has a opening connected with said opening of said elastic sheet; said probe of said probe portion is contacted to said second signal testing electrode of said semiconductor device through openings provided, respectively, in said base plate and said elastic sheet.

26. A semiconductor device testing apparatus as claimed in claim 13 or claim 25, wherein said first signal testing electrode on said contact sheet has a bump electrode structure.

27. A semiconductor device testing apparatus as claimed in claim 13 or claim 25, wherein said signal electrode of said semiconductor device has a bump electrode structure.

28. A semiconductor device testing apparatus as claimed in claim 27, wherein each of said first and second supply voltage applying electrodes of said contact sheet has a bump electrode structure.

29. A semiconductor device testing apparatus as claimed in claim 27, wherein each of said first and second electrodes of said semiconductor device has a bump electrode structure.

30. A semiconductor device testing apparatus as claimed in claim 27, wherein a bypass capacitor connecting between said first wiring and said second wiring is provided.

31. A semiconductor device testing apparatus as claimed in claim 27, wherein said contact sheet has a larger area than said semiconductor device to be tested.

32. A semiconductor device testing apparatus as claimed in claim 27, wherein said semiconductor device is tested in a semiconductor wafer state in which a plurality of said semiconductor devices are formed.

33. A semiconductor device testing apparatus as claimed in claim 27, wherein a form of said semiconductor device to be tested is a bare chip diced from a semiconductor wafer.

34. A semiconductor device testing apparatus as claimed in claim 27, further comprising a scrubbing portion; said scrubbing portion includes a piezoelectric device moving said device stage and a controller to control said piezoelectric device so that said electrodes on said semiconductor device and said electrodes on said contact sheet are relatively vibrated at their contact state to break a thin oxide film which has been unfavorably formed on the surface on said electrodes.

35. A semiconductor device testing apparatus as claimed in claim 27, wherein said first and second external terminals are connected to power supply voltage wirings from said power source portion by a soldered portion.

36. A semiconductor device testing apparatus as claimed in claim 27, wherein said first and second external terminals are connected to power supply voltage wirings from said power source portion by a pogo-pin.

37. A semiconductor device testing apparatus as claimed in claim 27, wherein said first and second external terminals are connected to power supply voltage wirings from said power source portion by a needle.

38. A semiconductor device testing apparatus as claimed in claim 27, wherein said first and second external terminals are connected to power supply voltage wirings from said power source portion by an anisotropic conductive sheet.

* * * * *